(12) United States Patent
Pfaffinger et al.

(10) Patent No.: US 11,157,840 B2
(45) Date of Patent: Oct. 26, 2021

(54) METHOD AND DEVICE FOR DETERMINING OPTIMUM BATCH SIZES

(71) Applicant: Siemens Aktiengesellschaft, Munich (DE)

(72) Inventors: Alexander Pfaffinger, Munich (DE); Christian Royer, Ottobrunn (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 425 days.

(21) Appl. No.: 16/327,554

(22) PCT Filed: Aug. 24, 2016

(86) PCT No.: PCT/EP2016/069982
§ 371 (c)(1),
(2) Date: Feb. 22, 2019

(87) PCT Pub. No.: WO2018/036622
PCT Pub. Date: Mar. 1, 2018

(65) Prior Publication Data
US 2019/0213508 A1     Jul. 11, 2019

(51) Int. Cl.
*G06Q 10/04*     (2012.01)
*G06Q 50/04*     (2012.01)
(Continued)

(52) U.S. Cl.
CPC .......... *G06Q 10/043* (2013.01); *G06Q 10/04* (2013.01); *G06Q 50/04* (2013.01);
(Continued)

(58) Field of Classification Search
CPC ...... G06Q 10/043; G06Q 10/04; G06Q 50/04; H05K 13/0038; H05K 13/085; Y02P 90/30
(Continued)

(56) References Cited

U.S. PATENT DOCUMENTS 7,027,885 B1 * 4/2006 Barto ...................... G06Q 50/04
700/99
2008/0256541 A1 * 10/2008 Rai ........................ G06F 3/1217
718/101
(Continued)

FOREIGN PATENT DOCUMENTS

DE     102015200420 A1     7/2016
EP     1403748 A1     3/2004
(Continued)

OTHER PUBLICATIONS

Czap Hans: "An Heuristic for Lot Sizing and Scheduling", Methods of Operations Research, 43, XX, XX, pp. 181-192, XP000747435, ISSN: 0173-752X; 1981
(Continued)

*Primary Examiner* — Michael J Brown
(74) *Attorney, Agent, or Firm* — Schmeiser, Olsen & Watts LLP

(57) ABSTRACT

Provided is a method for determining optimum batch sizes for the placing of components on circuit boards within an assembly line, wherein a set of circuit board types to be produced on the assembly line within a specified planning period is specified; a number of circuit boards to be produced is specified for each circuit board type; the number of circuit boards per circuit board type forms a set that is to be divided into equal-sized subsets, also referred to as batches, which are production orders that are produced at regular intervals during the planning period; the batch size of a circuit board type is equal to the number of circuit boards in a subset; the specified circuit board types are divided into a set of clusters, wherein a cluster and its associated set-up includes a set of circuit board types which can be produced with the associated set-up.

31 Claims, 3 Drawing Sheets

(51) Int. Cl.
*H05K 13/08* (2006.01)
*H05K 13/00* (2006.01)

(52) U.S. Cl.
CPC ....... *H05K 13/0038* (2013.01); *H05K 13/085* (2018.08); *Y02P 90/30* (2015.11)

(58) Field of Classification Search
USPC .......................................................... 700/96
See application file for complete search history.

(56) References Cited

U.S. PATENT DOCUMENTS

| | | | |
|---|---|---|---|
| 2011/0130857 A1* | 6/2011 | Budiman | G05B 13/04 700/104 |
| 2017/0374745 A1 | 12/2017 | Pfaffinger et al. | |

FOREIGN PATENT DOCUMENTS

| | | |
|---|---|---|
| WO | 2014079601 A1 | 5/2014 |
| WO | WO 2014079601 A1 | 5/2014 |
| WO | 2016113021 A1 | 7/2016 |
| WO | WO 2016113021 A1 | 7/2016 |

OTHER PUBLICATIONS

Aghezzaf El Houssaine et al: "Hybrid flowshops: An LP based heuristic for the planning level problems", Emerging Technologies and Factory Automation, 1995, ETFA '95, Proceedings, 1995 INRIA/IEEE Symposium on Paris, France, Oct. 10-13, 1995, Los Alamitos, CA, USA, IEEE Comput. Soc, US, vol. 1, pp. 551-559, XP010160354, DOI: 10.1109/ETFA.1995.496807, ISBN: 978-0-7803-2535-7; 1995.

Non-English: Wikipedia, Klassische Losformel, pp. 1-11, https://de.wikipedia.org/wiki/Klassische_Losformel.

Jinxing Xie et al: "A parallel heuristic algorithm for multi-stage lot-sizing in general production systems", Systems, Man and Cybernetics, 1996, IEEE International Conference on Beijing, China Oct. 14-17, 1996, New York, NY, USA, IEEE, US, vol. 2, pp. 1542-1547, XP010206892, DOI: 10.1109/ICSMC.1996.571376, ISBN: 978-0-7803-3280-5; 1996.

Hennet J C: "A decomposed resolution technique for the cyclic economic lot-sizing and scheduling problem", Proceedings / 1999 7th IEEE International Conference on Emerging Technologies and Factory Automation : Oct. 18-21, 1999, UPC, Barcelona, Catalania, Spain, IEEE Service Center, Piscataway, NJ, vol. 2, pp. 1117-1122, XP010365684, DOI: 10.1109/ETFA.1999.813114, ISBN: 978-0-7803-5670-2; 1999.

PCT International Search Report dated May 22, 2017 and corresponding to PCT International Application No. PCT/EP2016/069982 filed on Aug. 24, 2016.

* cited by examiner

METHOD AND DEVICE FOR DETERMINING OPTIMUM BATCH SIZES

CROSS-REFERENCE TO RELATED APPLICATIONS

This application claims priority to PCT Application No. PCT/EP2016/069982, having a filing date of Aug. 24, 2016, the entire contents both of which are hereby incorporated by reference.

FIELD OF TECHNOLOGY

The embodiments of the invention relate to a method and to a device for determining optimum batch sizes for the placing of components on circuit boards within a pick and place line.

Furthermore, the embodiments of the invention relate to a device for a pick and place system or a production line or assembly line for placing components or parts on circuit boards (assemblies). Furthermore, the embodiments of the invention relate to a computer program product and to a computer-readable medium.

BACKGROUND

In particular within the field of electronic production, circuit boards and/or assemblies which are to be produced are produced on SMT pick and place lines by means of surface mounted technology (SMT). A producer of automatic SMT pick and place machines and systems with the product name SIPLACE is, for example, the company ASM (http://www.siplace.com/en/Home).

A plurality of automatic pick and place machines, which are usually connected by a conveyor system and which interact e.g. in order to produce (electronics) components, constitute a pick and place line.

A set-up can be kept on one or more set-up tables which can easily be exchanged at the automatic set-up machine. However, equipping a set-up table with components of predetermined component types is laborious. The set-ups are therefore often differentiated into standard set-ups and variant set-ups, wherein a standard set-up table is provided for retaining its composition of component types over a determined planning time period, while a variant set-up table is expected to be refitted within the planning time period.

In the industrial production units in the fields of electronics production, assemblies (or circuit boards) which are to be produced are produced in orders with fixedly predefined batch sizes.

The batch sizes implicitly define how frequently an assembly is to be produced. The smaller the batch size of an assembly, the more frequently this assembly has to be produced and therefore the higher the set-up costs.

However, if a continuous demand for an assembly is assumed, as batch sizes increase there is also a need for an ever larger buffer according to the SMT line and therefore the warehousing costs rise.

Within the scope of lean manufacturing, even a theoretical batch size of 1 is envisaged with the objective of minimizing inventory, but in practice this would lead to huge set-up costs.

It takes approximately 6-8 hours to produce a component set-up for a pick and place line and therefore incurs enormous expenditure. The assemblies are therefore produced in set-up families. A set-up family is in this context a quantity of components which can be produced with a component set-up of the pick and place line.

In other words, a set-up family, also referred to as a cluster, comprises a quantity of batches which can be produced within one set-up. All the assemblies of one set-up family can therefore be produced successively without changing the set-up on the line.

Static set-up families are set-up families which are formed for the medium term (6-12 months). The assemblies which are planned in this time period are divided into set-up families and preconceived set-ups are formed for them. If a static set-up family is set-up in a short-term planning time period, which can be e.g. a time interval of one day, all the assemblies of this set-up family are usually not produced but instead only those for which there are currently orders. The use of static set-up families is customary practice in many electronics works. The receipt of orders is rather random and usually cannot be planned. Even if two assemblies always have to be produced once every week, it is generally not possible to plan that this will take place on the same day of the week, and the set-up of the set-up family would therefore perhaps have to be set-up one time fewer.

DE 102015200420.1 discloses a method for populating circuit boards which comprises the following steps:

recording orders, in each case for populating circuit boards of a circuit board type on the pick and place line, and associated probabilities with which an order is to be respectively carried out, the assignment of circuit board types of the orders to set-up families, determining, for each set-up family, a characteristic number which comprises the sum of the probabilities of those orders whose circuit board types are included in the set-up family, the optimization of the assignment in such a way that the characteristic numbers of different set-up families are as different as possible, making available a set-up of one of the determined set-up families at the pick and place line and populating circuit boards on the pick and place line.

The orders can relate to virtually any desired time period in the future. In this context, it is usually not known—or not precisely known—when an order will actually be present, that is to say when the order is to be executed. The operation of the pick and place line usually follows a predetermined regular cycle, wherein the orders which are to be respectively processed for a coming time period are known in each case. The probability of the order specifies how probable it is that an order will have to be executed in a random time period.

When the set-up families or setups are formed, the method can make use of the knowledge that specific circuit board types are to be populated again on a regular basis.

Owing to these complex relationships, the definition of optimum batch sizes constitutes a very significant problem in practice.

According to Wikipedia (https://de.wikipedia.org/wiki/Klassische_Losformel) in the German speaking world the classic batch formula or Andler formula (known in English as the Economic Order Quantity, EOQ formula) uses known methods for determining the optimum batch size within the scope of single-stage, uncapacitated industrial fabrication.

In contrast in the English speaking world the term Economic order quantity (EOQ formula) is predominant, wherein the problem is approached in terms of the optimum order quantity. There are points in common between the order quantity and the production quantity. The determination of optimum order quantities forms part of the tasks of the procurement logistics, wherein the total costs are also composed of linear warehousing costs which are dependent on the quantity and ultimately also of the set-up costs in the case of batch production.

In the field of electronics production, the determination of batch sizes according to the batch formula or EOQ formula has not proven successful in practice, since this formula does not take into account at all the fact that the assemblies are produced in set-up families.

SUMMARY

An aspect relates to optimizing the batch sizes.

The embodiments of the invention claim a method for determining optimum batch sizes for the placing of components on circuit boards within a pick and place line,
wherein a quantity of circuit board types to be produced on the pick and place line is predefined within a predefined planning time period,
wherein a number of circuit boards which is to be produced is predefined per circuit board type,
wherein the number of circuit boards per circuit board type forms a quantity which is to be divided into equally large sub-quantities, also referred to as batches, which are produced distributed uniformly in terms of timing over the planning time period as production orders,
wherein the batch size of a circuit board type represents the number of circuit boards in a sub-quantity,
wherein the predefined circuit board types are divided into a quantity of set-up families,
wherein a set-up family with an associated set-up comprises a quantity of circuit board types which can be produced with the associated set-up, wherein the method comprises the following steps:
recording set-up costs which are incurred for setting up the associated set-up of a set-up family,
determining the time intervals between the production orders per circuit board type as a function of the batch size,
determining the set-up costs per set-up family over the planning time period as a function of the batch sizes of the circuit board types and taking into account the recorded set-up costs,
determining the total set-up costs from the sum of the set-up costs per set-up family,
determining the total warehousing costs of the circuit boards produced in a time interval within the planning time period, from the sum of the warehousing costs per circuit board type as a function of the batch sizes, and
optimizing the batch sizes in such a way that the sum of the total set-up costs and total warehousing costs is minimized.

A significant advantage of the embodiments of the invention is that with the optimized batch sizes an optimum compromise is achieved between the expenditure on setting up, on the one hand, and warehousing space or expenditure on warehousing space, on the other.

According to the optimized batch sizes, set-ups and warehousing capacities can be made available per time interval. A time interval corresponds to a short-term planning time period and is typically one day. The assemblies which have to be produced in such a time interval are produced in the predefined set-up families. The set-up of a predefined set-up family is implemented at most once in one time interval. Such a set-up is possibly not implemented completely. Then, only the components which are necessary to populate the assemblies which are to be produced in this time interval are then set up.

The method can additionally comprise the following steps which are taken into account for optimizing of the batch size:
determining the probability per circuit board type that a circuit board has to be produced in a time interval within the planning time period, and
determining the expected values per set-up family, which values respectively express the probability of at least one circuit board type from the set-up family having to be produced in the specified time interval.

The set-up costs per set-up family correspond here to the expected set-up costs per set-up family. They can be calculated from the determined expected values, the specified recorded set-up costs and the number of time intervals of the planning time period.

One development of the embodiments of the invention provides that each possible starting time interval for the determined time intervals between the production orders of a circuit board type within the planning time period is equally probable and independent of other circuit board types.

The optimization of the batch sizes can be carried out with an iterative optimization method with a predefinable initial value. The optimization can additionally or alternatively be carried out by means of what is referred to as non-linear optimization.

In a further embodiment of the invention, the set-up costs per set-up family each have fixed amounts. They can also have identical amounts in each case for each set-up family or respectively different amounts for each set-up family.

The total set-up costs can be variable by virtue of the fact that the costs for the setting up of one or more required components in a set-up are taken into account in the total set-up costs. The absolute value of the set-up costs of a set-up family in the specified time interval can be dependent on the sub-quantity of the component types which are sufficient for the respective production orders.

A further aspect of the embodiments of the invention provides a device for determining optimum batch sizes for the placing of components on circuit boards within a pick and place line,
wherein a quantity of circuit board types to be produced on the pick and place line is predefined within a predefined planning time period,
wherein a number of circuit boards which is to be produced is predefined per circuit board type,
wherein the number of circuit boards per circuit board type forms a quantity which is to be divided into equally large sub-quantities, also referred to as batches, which are produced distributed uniformly in terms of timing over the planning time period as production orders,
wherein the batch size of a circuit board type represents the number of circuit boards in a sub-quantity,
wherein the predefined circuit board types are divided into a quantity of set-up families,
wherein a set-up family with an associated set-up comprises a quantity of circuit board types which can be produced with the associated set-up, having:
means for recording set-up costs which are incurred for setting up the associated set-up of a set-up family,
means for determining the time intervals between the production orders per circuit board type as a function of the batch size, means for determining the set-up costs per set-up family over the planning time period as a function of the batch sizes of the circuit board types and taking into account the recorded set-up costs, means for determining the total set-up costs from the sum of the set-up costs per set-up family, means for determining the total warehousing costs of the circuit boards produced in a time interval within the planning time period from the sum of the warehousing costs per circuit board type as a function of the batch sizes, and means for optimizing the batch sizes in such a way that the sum of the total set-up costs and total warehousing costs can be minimized.

The device can provide means and/or units or devices and/or modules for carrying out the abovementioned method, which can each be embodied by hardware and/or firmware and/or software or as a computer program or computer program product (non-transitory computer readable storage medium having instructions, which when executed by a processor, perform actions).

The device can be correspondingly developed like the method described above.

A further aspect of the embodiments of the invention provides a pick and place system having such a device according to the embodiments of the invention.

This pick and place system can be part of an installation.

The installation can be characterized, inter alia, by one of the following installation types. Examples of this are:
an automation plant,
a production plant,
a cleaning plant,
a water treatment plant,
a piece of equipment or a machine,
a continuous-flow machine,
a power plant.

A further aspect of the embodiments of the invention is a computer program product or a computer program with means for carrying out the method specified above when the computer program (product) is executed in an abovementioned device or a means of the device. The computer program or computer program product can be stored on a computer-readable medium. The computer program or computer program product can be produced in a conventional programming language (e.g. C++, Java). The processing apparatus can be a commercially available computer or server with corresponding input means, output means and storage means. This processing apparatus can be integrated in the device or in means thereof.

BRIEF DESCRIPTION

Some of the embodiments will be described in detail, with reference to the following figures, wherein like designations denote like members, wherein.

Figure 3:
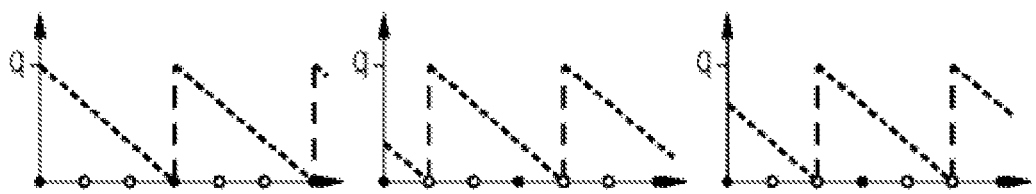
Figure 4:
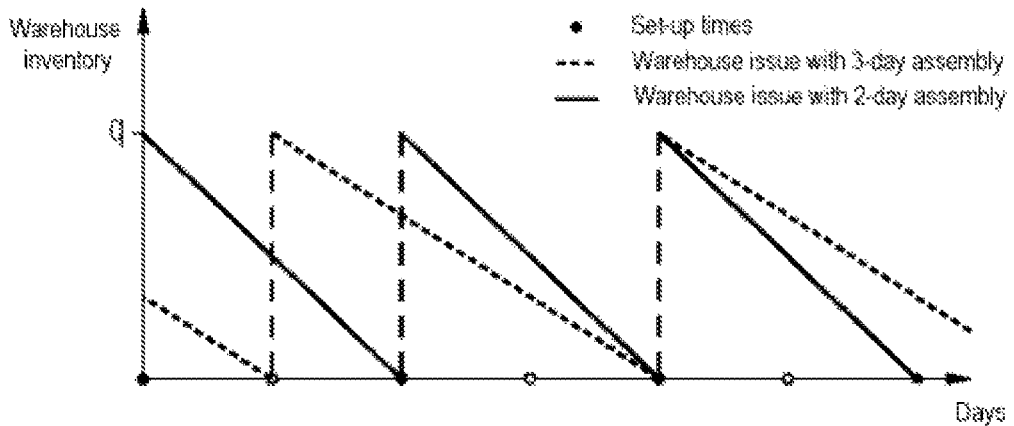
Figure 5:
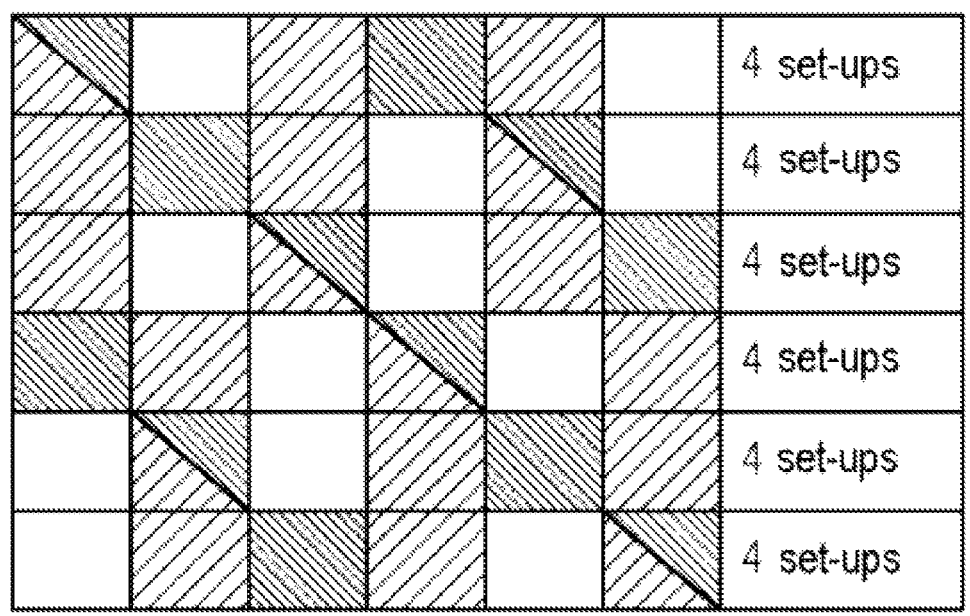

FIG. 3 shows three graphics with the warehousing inventory q and set-up times when the orders arrive on the days 1, 4, 7, . . . , on the left, on the days 2, 5, 8, . . . , in the center, or on the days 3, 6, 9, . . . , on the right;

FIG. 4 shows a graphic with the warehousing inventory q and set-up times with 2 and 3-day orders in a cluster; and FIG. 5 schematically shows different cluster set-up configurations for a total period length of 6 days.

DETAILED DESCRIPTION

Figure 1:
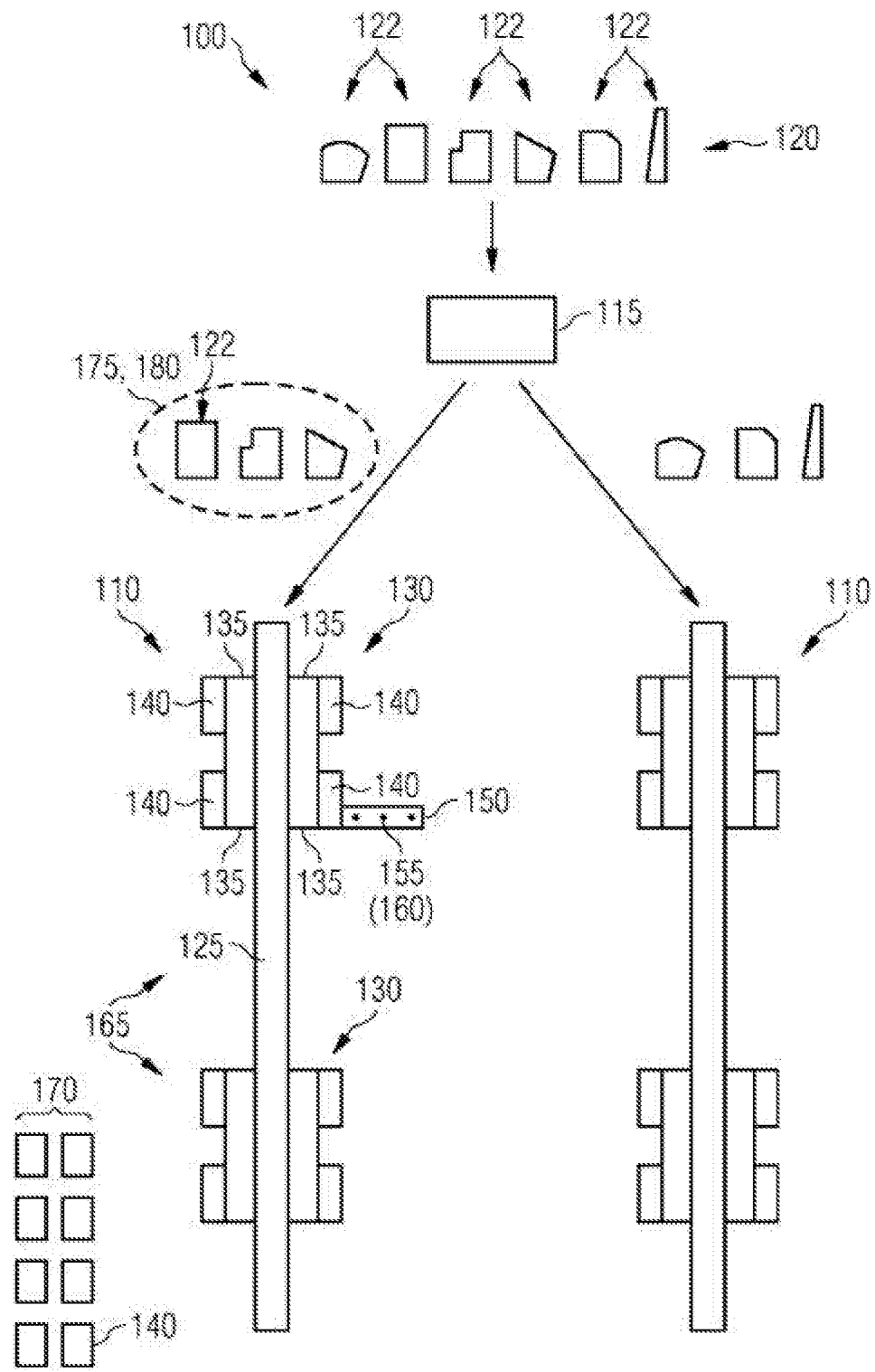
FIG. 1 shows a pick and place system.

FIG. 1 shows an exemplary pick and place system 100. The pick and place system 100 comprises one or more pick and place lines 110 and a processing or control apparatus 115. Each pick and place line 110 comprises an optional conveyor system 125 and one or more automatic pick and place machines 130. Each automatic pick and place machine 130 comprises one or more pick and place heads 135 which are each configured to receive components 155 from a set up table 140 and to position said components 155 at a predetermined position on the circuit board 120 which is located on the conveyor system 125. During the pick and place process, the circuit board 120 is usually immobile with respect to the automatic pick and place machine 130.

The set-up tables 140 each comprise a multiplicity of feed apparatuses 150, of which only one is shown by way of example in FIG. 1. Each feed apparatus 150 keeps available a supply of components 155 of a predetermined conveyor type 160. The feed apparatus 150 usually has a capacity for the components 155 which can be expressed in tracks. A track is usually 8 mm wide, and the number of tracks of a set-up table 140 is limited, for example, to 40. Components 155 of the same component type 160 are usually made available in a strip, on a tray or in a tube. Each component type 160 requires a predetermined number of tracks, usually adjoining one another, on the feed apparatus 150 and on the set-up table 140.

A feed apparatus 150 can usually be configured to keep available components 155 of different component types 160 and different feed apparatuses 150 can usually be mounted on a set-up table 140. In the present case, for the sake of simplification it is assumed that a supply of components 155 of a component type 160 at a feed apparatus 150 is virtually infinitely large, and refitting is therefore not necessary.

If a component 155 of a component type 160 which is not present at one of the set-up tables 140 is required at the automatic pick and place machine 130, the assignment of components 155 at one of the mounted set-up tables 140 is usually not changed but instead the set-up table 140 is completely replaced with another, suitably populated set-up table 140. The placing of components 155 on a set-up table 140 which has not been mounted on the pick and place line 110 is referred to as a preliminary set-up, and can require a processing time in the range of one or more hours, for example approximately 6-8 hours.

Since changing set-up tables 140 on the pick and place line 110, referred to as a set-up change, usually entails stopping the production, efforts are made to ensure that changes of the set-up tables 140 are carried out as rarely as possible. Since the set-up tables 140 are also expensive and the changing of the set-up of a set-up table 140 can be costly and prolonged, attempts are made to ensure that the smallest possible number of set-ups are formed, in order to produce a predetermined production quantity of circuit boards 120 of predetermined circuit board types 122. The production quantity comprises here a plurality of circuit board types 122, of which in each case a predetermined number of circuit boards 120 is to be populated with components 155 of predetermined component types 160. For example, 300 circuit boards 120 of a first circuit board type 122, and 200 circuit boards 120 of a second circuit board type 122 can be populated.

A set-up 165, 170 comprises a quantity of component types 160 and is implemented by means of one or more set-up tables 140 which are equipped with supplies of components 155 of the component types 160 of the set-up 165, 170 and are mounted on the pick and place line 110.

The set-up 165, 170 is assigned a set-up family 175 which comprises circuit board types 122, of which circuit boards 120 can be populated with components 155 of the component types 160 of the set-up 165, 170. A set-up family 175 is assigned to precisely one set-up 165, 170, and vice versa.

In order to increase the utilization rate of a pick and place line 110 or to reduce a demand for set-up tables 140, it is therefore decisive how set-up families 175 are formed on the basis of the circuit board types 122 to be populated. When forming set-ups 165, 170 or set-up families 175 it is possible to take into account additional conditions, for example the compliance with a limited capacity of a set-up table 140 for component types 160 or a grouping of predetermined circuit board types 160 in the same set-up family 175, for example for reasons associated with the use of lead-containing or lead-free solder.

The set-ups can be differentiated into standard set-ups 165 and variant set-ups 170, wherein a standard set-up 165 is fitted to remain setup without change on a number of changing tables 140 over a predetermined planning time period, while a changing table 140 of a variant set-up 170 is expected to be fitted with a different set-up with components 155 of other component types 160 within the planning time period. The planning time period can be, for example, 6 to 12 months. A variant set-up 165 comprises a predetermined configuration which is usually significantly shorter than the planning time period, for example over several hours or days, but usually not over more than one week.

It is also possible to form a static set-up which has elements of the standard set-up 165 and of the variant set-up 170. The static set-up is formed, like the standard set-up 165, for a relatively long time period over which it usually remains unchanged. However, the static set-up is usually not fitted, that is to say the set-up is implemented physically on set-up tables 140 but can also be removed gain after use. Furthermore, a static set-up can also be implemented only partially if, for example, the static set-up comprises a plurality of circuit board types 122 and at one point in time only orders for the production of circuit boards 120 of some of these circuit board types 122 are present. Components 155 of such component types 160 which are not necessary for populating the ordered circuit boards 120 cannot then be fitted.

The static set-up is frequently easier to handle in terms of technical administration than a standard set-up 165 or variant set-up 170. If the static set-up is not removed after its use, it can also be referred to as a standard set-up 165. In the section which follows, unless stated otherwise, static set-up families and the static set-up assigned to them are preferably meant.

The set-ups 165, 170 can, when required, be exchanged on the pick and place line 110. In order to implement a standard set-up 165 or a variant set-up 170, a set-up table 140 is usually populated with supplies of components 155 of predetermined component types 160 while said set-up table 140 is not mounted on the pick and place line 110. Components 155 which are of non-required component types 160 and have already been fitted can be previously removed. This changing of the set-up can comprise a considerable amount of manual work and be time-consuming.

In order to minimize the expenditure which is associated with a variant set-up 170, attempts are made to incorporate as many circuit boards types 122 in the standard set-ups 165. However, an aimed-at case without variant set-ups 170 is virtually impossible to achieve.

The control apparatus 115 assigns, within the scope of the control of the pick and place system 100, circuit board types 122 whose assigned circuit boards 120 are to be placed on the pick and place line 110, in each case to a set-up family 175, wherein standard set-up families 175 which are respectively assigned to a standard set-up 165 and variant set-up families 175 which are respectively assigned to a variant set-up 170 can be formed.

In practice, in a first step, it is possible to form, for example for a predefined production quantity of the circuit board types 122, a standard set-up 165 for a portion (as large as possible) of the circuit board types 122, after which, in a second step, variant set-ups 170 are formed for the remaining portion of the circuit boards 122. The quality of these assignments decides to a high degree how well the capacity of the production means of the pick and place system 100 can be utilized and how efficiently the placing process can be carried out here.

According to the embodiments of the invention, a mathematical stochastic model for calculating optimum batch sizes is presented in which the production with static set-up families is taken into account.

In the following probabilistic model it is assumed that the orders arrive according to certain probabilities.

Input parameters:

quantity of all the assembly types R.

The assembly types from R are divided into a quantity of set-up families Cl.

The number of days in the year/long-term planning period are T.

The predicted number of an assembly r which is to be produced is then $D_r$.

Variables:

The batch size $q_r$ for the assemblies r.

Model:

As in the classic EOQ model mentioned at the beginning, it is assumed that the demand is constant. The orders for an assembly type are consequently received periodically.

In addition, as in the classic EOQ model, an infinitely fast production speed, i.e. a production time of 0 is assumed. The same is assumed for the set-up time.

The time interval in which orders are received for an assembly r is denoted by $w_r$. The following applies:

$$w_r = \frac{q_r T}{D_r}$$

The model or the embodiments of the invention is explained below with reference to examples without being limited thereto:

Example (1)

Figure 2:
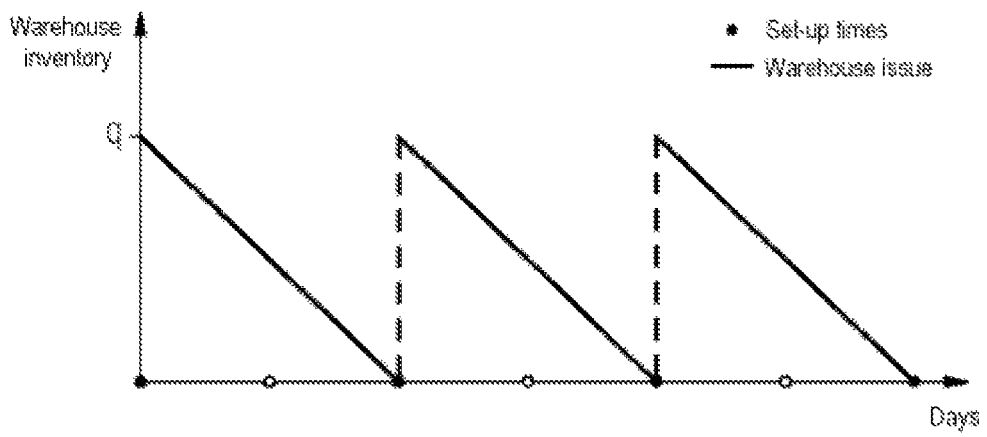
FIG. 2 shows a graphic with the warehousing inventory q and set-up times when orders arrive every 2 days.

The number of days in the planning time period is T=100. If, for an assembly r, the predicted number to be produced $D_r$=1000 items and the batch size $q_r$=20 items, then $w_r$=2, i.e. the assembly has to be produced every two days. In FIG. 2, a graphic shows the situation if orders are received every two days. The warehousing inventory q is plotted on the y axis. The days are plotted on the x axis, starting at 1. The point of intersection between the warehouse issue line and the x axis is what is referred to as the set-up time, wherein the set-up time means that the set-up is implemented for this set-up family (cluster) on this day.

Example (2)

If $w_r=3$, orders for an assembly r arrive every three days.

There are various possible ways for these orders to arrive precisely on which days. If $w_r=3$, the orders may a) be received on the days 1, 4, 7, . . .

b) or on the days 2, 5, 8, . . .

c) or on the days 3, 6, 9, . . .

FIG. 3 illustrates three possibilities on the left a), in the center b) and on the right c).

It is assumed that the various possibilities for the receipt of the orders of an assembly type have an equal probability and are independent of the other assembly types. The first receipt of an order is referred to as the starting interval—in the example the precise starting day, wherein in the example it is assumed that a time interval is a day.

If an order for the assembly type of a set-up family is received on one day, the set-up for this set-up family is implemented on this day.

Example (3)

A set-up family is composed of two assembly types, a 2-day and a 3-day assembly type. FIG. 4 illustrates possible set-up times for the set-up of the set-up family.

In the example according to FIG. 4, the set-up family is implemented on the days 2, 3, 5 and 7.

If, as here in the example, the period lengths or time intervals are integers, the total period length for the assemblies is the smallest total multiple (kgV) of the individual period lengths. For the two assembly types in the example this is 6. The resulting cluster set-ups for the 6 different configurations on the 6 days in the total period are given in FIG. 5. The expected number of clusters for the 6 days is accordingly 4. The expected number of clusters on one day is consequently 1.5.

However, it is not a precondition that the period lengths be integers. It is, for example, permissible to produce an assembly type r even twice in the (working) week, i.e. every 2.5 days.

Additional costs parameters:

the assemblies are produced with predefined set-up families cl∈Cl. The setting up of a set-up family entails fixed set-up costs $K_{cl}$.

The warehousing costs for a quantity unit of the assembly type r are $h_r$ per day.

Model properties:

Set-up costs:

In general, the probability of an assembly having to be produced on a day is:

$$p_r = \frac{1}{w_r} = \frac{D_r}{q_r T}$$

For an assembly type r which is to be produced twice a week, i.e. $w_r=2.5$, the probability of it having to be produced on a specific day is $p_r=1/2.5=2/5$.

The expected value for a set-up family cl∈Cl having to be produced on a day is obtained as follows:

$$EW(cl) =$$

probability of at least one assembly $r \in cl$ having to be produced =

1 − probability of no assembly $r \in cl$ having to be produced =

$$1 - \prod_{r \in cl}(1 - p_r) = 1 - \prod_{r \in cl}\left(1 - \frac{D_r}{q_r T}\right)$$

The following are therefore obtained as the expected set-up costs for the set-up family cl:

$$\text{Set-up costs} = K_{cl}T\left(1 - \prod_{r \in cl}\left(1 - \frac{D_r}{q_r T}\right)\right)$$

The total set-up costs are therefore:

$$\text{Set-up costs} = \sum_{cl \in Cl} K_{cl}T\left(1 - \prod_{r \in cl}\left(1 - \frac{D_r}{q_r T}\right)\right)$$

Warehousing costs:

For an assembly type r the expected annual warehousing costs are, in the classic EOQ model, $Tq_r/2$.

The warehousing costs are therefore in total:

$$\sum_{r \in R} \frac{h_r q_r T}{2}$$

The total costs are obtained from the sum of the total set-up costs and the total warehousing costs.

Expansions:

(1) Taking into Account the Fitting of Individual Component Types

If the set-up of a static set-up family is implemented, not all the component types of the set-up are fitted rather only those which are necessary for the production of the orders which are to be produced. In other words, the set-up costs of a set-up family in the specified time interval, in the example one day, may be dependent on the sub-quantity of the component types which are sufficient for the respective (production) orders.

This can be taken into account in the model and the set-up expenditure can be determined in more detail.

Additional parameters:

$C_{cl}$ component types of the assembly types $r \in cl$.

$cl_c$ assembly types in the set-up family cl which contain the component type c.

k costs for the fitting of a component in a set-up.

The expected value for a component type $c \in C_{cl}$ having to be fitted in the set-up of the set-up family cl on a day is $$1 - \prod_{r \in cl_c}(1 - p_r)$$

The expected number of fittings of a component for cluster cl on a day is consequently $$\sum_{c \in C_{cl}} \left(1 - \prod_{r \in cl_c} (1 - p_r)\right)$$

The total set-up costs are therefore:

$$\text{Set-up costs} = \sum_{cl \in Cl} kT \sum_{c \in C_{cl}} \left(1 - \prod_{r \in cl_c} \left(1 - \frac{D_r}{q_r T}\right)\right)$$

(2) Taking into Account Fixed and Variable Set-Up Costs

The set-up costs $K_{cl}$ which have been presented at the beginning in this section can also be considered as fixed costs of the set-ups, and the set-up costs from expansion (1) can be considered as variable set-up costs. The costs for the fitting of one or more required components in a set-up are then taken into account in the total set-up costs. Combinations of both (fixed and variable set-up costs) are also conceivable.

With the presented model it is possible to make comparisons between and assessments of various batch size variants in which the production with set-up families is taken into account.

Using iterative optimization methods it is possible to determine batch sizes with which a total cost minimum is achieved.

The following is assumed: $D_r \geq 1$. Therefore, the following lower and upper limit for $q_r$ is assumed:

$$1 \leq q_1 \leq D_r$$

Iterative optimization methods can be characterized by the following (iterative) steps:
a) determining a starting solution or first current solution from an initial value which can be predefined (by the user). For example it is possible to start with an initial value of a batch size=1 and therefore to determine the starting costs or current total costs (total set-up costs+total warehousing costs),
b) calculating a new batch size by means of an optimization program or a standard solver (see below), wherein the total set-up costs and total warehousing costs are minimized incrementally, and
c) repeating b) until a sufficient balance is achieved between a largest possible batch size (consequently minimum set-up costs) and minimum warehousing costs.

Accordingly, the steps are carried out iteratively and a program abort takes place if a previously defined time limit or result quality (see e.g. the above balance) is achieved.

A special case of optimization methods is the linear optimization. It is concerned with the optimization of linear target functions by means of a quantity which is restricted by linear equations and inequations. It is the basis of the solution method of the (mixed) integer linear optimization. What is referred to as a solver is a generic term for specific mathematical computer programs which can solve mathematical problems numerically. In the context of MIP (mixed integer linear programming) it is possible to use standard solvers such as e.g. CPLEX, Scip, Gurobi, Xpress for small IP programs (integer optimization models).

The case of non-linear integer optimization (MINLP) is more difficult than linear optimization, in which integer optimization (MINLP) the target function, the secondary conditions (NB) or both can be present. The solution is achieved by using separate linear approximations, with the result that standard solvers can be used directly. Moreover, the abovementioned standard solvers can each already solve specific types of non-linear problems. Furthermore, there are additional solvers which are specialized in the solution of non-linear problems (e.g. ANTIGONE, BARON).

By using non-linear integer optimization methods it is possible to determine batch sizes with which a total cost minimum is achieved.

If the integrality constraints of the $w_r$ are not preconditioned, the optimization problem is reduced to an easier to solve, pure non-linear optimization problem. In this case, batch sizes which are minimal in terms of total costs can be determined with pure non-linear optimization methods. For this purpose, for example the software which is suitable for solving mathematical problems and for carrying out numerical calculations with the name "Matlab" should be noted.

Although the embodiments of the invention have been illustrated and described in more detail here by means of the preferred exemplary embodiment, the invention is not limited by the disclosed examples, and other variations can be derived therefrom by a person skilled in the art without departing from the scope of protection of the embodiments of the invention.

The implementation of the processes or method sequences described above can be carried out on the basis of instructions which are present on computer-readable storage media or in volatile computer memories (referred to in summarized fashion below as computer-readable memories). Computer-readable memories are, for example, volatile memories such as caches, buffers or RAMs as well as non-volatile memories such as removable disks, hard disks etc.

The functions or steps described above can be present here in the form of at least one instruction set in/on a computer-readable memory. The functions or steps are not tied here to a specific set of instructions or to a specific form of sets of instructions or to a specific storage medium or to a specific processor or to specific execution schemes and can be executed by means of software, firmware, microcode, hardware, processors, integrated circuits etc. during isolated operation or in any desired combination. In this context, a wide variety of processing strategies can be used, for example serial processing by means of an individual processor or multiprocessing or multitasking or parallel processing etc.

Instructions can be stored in local memories, but it is also possible to store the instructions on a remote system and to access them via a network.

The term "processor", "central signal processing system", "control unit" or "data evaluation means" as used here comprises processing means in the widest sense, that is to say, for example, servers, universal processors, graphics processors, digital signal processors, application-specific integrated circuits (ASICs), programmable logic circuits such as FPGAs, discrete analog or digital circuits and any desired combinations thereof, including all other processing means which are known to a person skilled in the art or will be developed in the future. Processors can comprise one or more devices or apparatuses or units. If a processor is composed of a plurality of devices, they can be designed or configured to perform parallel or sequential processing and/or execution of instructions.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A method for determining optimum batch sizes for placing components on circuit boards within a pick and place line,
wherein a quantity of circuit board types to be produced on the pick and place line is predefined within a predefined planning time period,
wherein a number of circuit boards which is to be produced is predefined per circuit board type,
wherein the number of circuit boards per circuit board type forms a quantity which is to be divided into equally large sub-quantities, which are produced distributed uniformly in terms of timing over the planning time period as production orders,
wherein a batch size of a circuit board type represents the number of circuit boards in a sub-quantity,
wherein the predefined circuit board types are divided into a quantity of set-up families,
wherein a set-up family with an associated set-up comprises a quantity of circuit board types which can be produced with the associated set-up,
wherein the method comprises:
recording set-up costs which are incurred for setting up the associated set-up of a set-up family,
determining time intervals between production orders per circuit board type as a function of the batch size,
determining the set-up costs per set-up family over the planning time period as a function of the batch sizes of the circuit board types and taking into account the recorded set-up costs,
determining a total set-up costs from a sum of the set-up costs per set-up family,
determining total warehousing costs of the circuit boards produced in a time interval within the planning time period, from a sum of the warehousing costs per circuit board type as a function of the batch sizes, and
optimizing the batch sizes in such a way that the sum of the total set-up costs and total warehousing costs is minimized.

2. The method as claimed in claim 1, wherein the optimizing includes:
determining the probability per circuit board type that a circuit board has to be produced in a time interval within the planning time period, and
determining the expected values per set-up family, which values respectively express the probability of at least one circuit board type from the set-up family having to be produced in the specified time interval.

3. The method as claimed in claim 2, wherein the set-up costs per set-up family represented by the expected set-up costs per set-up family which are calculated from the determined expected values, the specified recorded set-up costs and the number of time intervals of the planning time period.

4. The method as claimed in claim 1, wherein set-ups and warehousing capacities per time interval are made available according to the optimized batch sizes.

5. The method as claimed in claim 1, wherein each possible starting time interval for the determined time intervals between the production orders of a circuit board type within the planning time period is equally probable and independent of other circuit board types.

6. The method as claimed in claim 1, wherein the optimization of the batch sizes is carried out with an iterative optimization method with a predefinable initial value.

7. The method as claimed in claim 1, wherein the optimization is carried out by means of what is referred to as non-linear optimization.

8. The method as claimed in claim 1, wherein the set-up costs per set-up family each have fixed amounts.

9. The method as claimed in claim 1, wherein the set-up costs per set-up family each have identical amounts.

10. The method as claimed in claim 9, wherein the total set-up costs are variable by virtue of the fact that the costs for the setting up of one or more required components in a set-up are taken into account in the total set-up costs.

11. The method as claimed in claim 1, wherein the set-up costs per set-up family each have different amounts.

12. The method as claimed in claim 1, wherein the absolute value of the set-up costs of a set-up family in the specified time interval is dependent on the sub-quantity of the component types which are sufficient for the respective production orders.

13. The method as claimed in claim 1, wherein a time interval represents a day.

14. The method as claimed in claim 1, wherein the time interval between the incoming production orders for a circuit board type is integral.

15. A computer program (non-transitory computer readable storage medium having instructions, which when executed by a processor, perform actions),
having means for carrying out the method as claimed in claim 1 when the computer program is executed on a device or in a unit or with means of the device as claimed in one of the abovementioned device claims.

16. A computer-readable medium, comprising instructions which, when they are executed on a suitable processing apparatus or the device or in one or more means of the device as claimed in one of the preceding device claims, cause the computer or the device or the unit or the means to carry out the method as claimed in claim 1.

17. A device for determining optimum batch sizes for placing components on circuit boards within a pick and place line,
wherein a quantity of circuit board types to be produced on the pick and place line is predefined within a predefined planning time period,
wherein a number of circuit boards which is to be produced is predefined per circuit board type,
wherein the number of circuit boards per circuit board type forms a quantity which is to be divided into equally large sub-quantities, also referred to as batches, which are produced distributed uniformly in terms of timing over the planning time period as production orders,
wherein the batch size of a circuit board type represents the number of circuit boards in a sub-quantity,
wherein the predefined circuit board types are divided into a quantity of set-up families,
wherein a set-up family with an associated set-up comprises a quantity of circuit board types which can be produced with the associated set-up,
comprising:
means for recording set-up costs which are incurred for setting up the associated set-up of a set-up family,
means for determining the time intervals between the production orders per circuit board type as a function of the batch size, means for determining the set-up costs per set-up family over the planning time period as a function of the batch sizes of the circuit board types and taking into account the recorded set-up costs, means for determining the total set-up costs from the sum of the set-up costs per set-up family, means for determining the total warehousing costs of the circuit boards produced in a time interval within the planning time period from the sum of the warehousing costs per circuit board type as a function of the batch sizes, and means for optimizing the batch sizes in such a way that the sum of the total set-up costs and total warehousing costs can be minimized.

18. The device as claimed in claim 17, wherein the device additionally has the following means which are suitable for optimizing the batch size:

means for determining the probability per circuit board type that a circuit board has to be produced in a time interval within the planning time period, and means for determining the expected values per set-up family, which values respectively express the probability of at least one circuit board type from the set-up family having to be produced in the specified time interval.

19. The device as claimed in claim 18, wherein the set-up costs per set-up family are represented by the expected set-up costs per set-up family which can be calculated from the determined expected values, the specified recorded set-up costs and the number of time intervals within the planning time period.

20. The device as claimed in claim 17, wherein the set-ups and warehousing capacities per time interval can be made available according to the optimized batch sizes.

21. The device as claimed in claim 17, wherein each possible starting time interval for the determined time intervals between the production orders of a circuit board type within the planning time period is equally probable and independent of other circuit board types.

22. The device as claimed in claim 17, wherein the optimization of batch sizes can be carried out with an iterative optimization method with a predefinable initial value.

23. The device as claimed in claim 17, wherein the optimization is carried out by means of what is referred to as a non-linear optimization.

24. The device as claimed in claim 17, wherein the set-up costs per set-up family each have fixed amounts.

25. The device as claimed in claim 17, wherein the set-up costs per set-up family each have identical amounts.

26. The device as claimed in claim 17, wherein the set-up costs per set-up family each have different amounts.

27. The device as claimed in the preceding claim 25, wherein the total setting up costs are variable by virtue of the fact that the costs for the set-up of one or more required components in a set-up can be taken into account in the total set-up costs.

28. The device as claimed in claim 17, wherein the amount of the set-up costs of a set-up family in the specified time interval is dependent on the sub-quantity of the component types which are sufficient for the respective production orders.

29. The device as claimed in claim 17, wherein a time interval represents a day.

30. The device as claimed in claim 17, wherein the time interval between the incoming production orders for a circuit board type is integral.

31. A pick and place system having a device as claimed in claim 17.

* * * * *